(12) United States Patent
Suzuki

(10) Patent No.: US 6,975,734 B1
(45) Date of Patent: Dec. 13, 2005

(54) AUDIO APPARATUS OF NEGATIVE DRIVING WITH ADAPTIVE GAIN CONTROL

(75) Inventor: Eiichi Suzuki, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/471,706

(22) Filed: Dec. 23, 1999

(30) Foreign Application Priority Data

Dec. 25, 1998 (JP) .................................. 10-371396

(51) Int. Cl.$^7$ .................. H03F 21/00; H03F 1/40; H04R 3/00; H03G 11/00
(52) U.S. Cl. ................ 381/121; 381/120; 381/96; 381/55; 330/112; 330/85; 330/102
(58) Field of Search ................ 700/94, 129; 381/121, 381/96, 107, 55, 108, 94, 59; 330/112, 85, 330/86, 104, 75, 102, 207 P, 298; 333/17.2

(56) References Cited

U.S. PATENT DOCUMENTS

| | | | | |
|---|---|---|---|---|
| 4,118,600 A | * | 10/1978 | Stahl | 381/98 |
| 4,254,303 A | * | 3/1981 | Takizawa | 381/107 |
| 4,369,412 A | * | 1/1983 | Sakano | 330/298 |
| 4,379,209 A | * | 4/1983 | Sakano | 381/120 |
| 4,398,157 A | * | 8/1983 | Dieterich | 330/86 |
| 4,405,831 A | * | 9/1983 | Michelson | 381/317 |
| 4,969,195 A | * | 11/1990 | Noro | 381/96 |
| 4,980,920 A | * | 12/1990 | Noro et al. | 381/96 |
| 4,987,564 A | | 1/1991 | Yokoyama | |
| 4,989,187 A | | 1/1991 | Yokoyama | |
| 5,206,912 A | | 4/1993 | Noro | |
| 5,359,665 A | | 10/1994 | Werrbach | |
| 5,577,126 A | * | 11/1996 | Klippel | 381/59 |
| 5,729,611 A | * | 3/1998 | Bonneville | 381/55 |
| 6,151,400 A | * | 11/2000 | Seligman | 381/317 |

FOREIGN PATENT DOCUMENTS

| | | | | |
|---|---|---|---|---|
| JP | 57026909 | 2/1982 | | |
| JP | 1-280998 | 11/1989 | | H04R 3/04 |
| JP | 1302997 | 12/1989 | | H04R 1/28 |
| JP | 1302998 | 12/1989 | | H04R 1/28 |

* cited by examiner

Primary Examiner—Vivian Chin
Assistant Examiner—Andrew Graham
(74) Attorney, Agent, or Firm—Pillsbury Winthrop Shat Pittman LLP

(57) ABSTRACT

An audio apparatus is constructed for use in negative drive of a loudspeaker having an internal impedance to perform a desired amplitude-frequency characteristic. In the audio apparatus, an amplifier device drives the loudspeaker with a driving voltage. A feedback device performs a positive feedback of a signal corresponding to the driving voltage of the loudspeaker to the amplifier device with a variable feedback gain, thereby causing the amplifier device to generate a negative impedance effective to negate the internal impedance of the loudspeaker. An adjustment device decreases the variable feedback gain of the feedback device as a level of the driving voltage of the loudspeaker increases, thereby adjusting the amplitude-frequency characteristic of the amplifier device.

8 Claims, 4 Drawing Sheets

AUDIO APPARATUS OF NEGATIVE DRIVING WITH ADAPTIVE GAIN CONTROL

BACKGROUND OF THE INVENTION

1. Field of the Invention

The present invention relates to an audio apparatus that is adapted for generation of low tones by means of a small loudspeaker, for example.

2. Description of Prior Art

Various conventional techniques are available and have been proposed for generating low tones or bass tones using small loudspeakers. For example, FIG. 4 shows an example of a loudspeaker driving circuit constructed by combining Helmholtz's resonance technique and negative driving technique. According to this circuit, low tones can be efficiently produced even when a small loudspeaker is used.

The circuit shown in FIG. 4 will now be described briefly. In FIG. 4, reference numeral 1 denotes an inversion amplification circuit 1 that includes resistors R1 and R2 for determining an amplification rate or gain, and a differential amplifier 2. A loudspeaker SP and a resistor Rs are inserted in series between an output terminal of the differential amplifier 2 and the ground. The junction point of the loudspeaker SP and the resistor Rs is connected via a feedback amplifier 5 to a positive input terminal of the differential amplifier 2. In this case, an amplification rate or gain of the feedback amplifier 5 is set to A (a fixed value). Reference numeral 6 denotes an adder, via which an input signal Si is inputted to the inversion amplification circuit 1. Further, an attenuator 10 and a level control circuit 11 together constitute a limiting circuit 12 that is inserted between the output terminal of the inversion amplification circuit 1 and the adder 6. Such a type of the audio apparatus is disclosed in Japanese Unexamined Patent Publication No. Hei 1-302997 and No. Hei 1-302998. The U.S. Pat. Nos. 4,987,564 and 4,989,187 are based on these Japanese patents, and all their contents are herein incorporated into the specification by referring to the patent numbers.

In the circuit of FIG. 4, output impedance Zo of the differential amplification circuit 1 is represented as:

$Zo = Rs \cdot (1 - ((R1+R2)/R1) \cdot A)$, and it is understood that the impedance Zo is given as a negative resistance.

Curves C1 to C3 in FIG. 2 represent voltage amplitude-frequency characteristics measured when the loudspeaker SP of the above-described circuit is in the loaded state. From the curve C1 to the curve C3 there is an increase in a level of the input voltage. The curves C1, C2 and C3 represent the frequency characteristics measured when the input voltage level is 0 dB, 10 dB and 20 dB, respectively. Level L1 in Fig. 2 indicates a limiting value for the voltage amplitude.

As for the curve C3, there is a portion in the low band area that exceeds the limiting level L1 (see a shaded portion in FIG. 2), and a clip occurs. That is, waveform components of the input signal that are present in this band area are distorted and higher order harmonics are generated. To avoid such a distortion, a limiter must be employed to prevent the voltage amplitude from reaching the level L1.

The amplitude-frequency characteristic of the circuit of FIG. 4 has two peaks as shown in FIG. 2, and the amplitude level on the low band side (around 30 Hz) is especially high. This characteristic is preferable when a low tone is to be outputted; however, the peaks on the low tone side must be limited in order to prevent the voltage amplitude from exceeding the limiting level L1. Therefore, the limiter must be activated even when the input voltage is still comparatively low. In the example of FIG. 2, the limiter must be activated when the input level exceeds 10 dB (corresponding to the curve C2). The limiting circuit 12 must be prepared so that the circuit can be activated in an early stage in order to cope with a possible rise in the input voltage.

However, if the limiter is applied at even a low level as is described above, optimal characteristics for the reproduction of low tones are not expected, and the full inherent performance of the audio system cannot be obtained.

As is described above, the conventional method is designed for applying the limiter while the voltage level is still low. In such a method, if the peak of the frequency characteristic of the audio apparatus is high, and if the input voltage level is increased (namely, the volume control is raised), the original frequency characteristic cannot be performed. Further, the limiter becomes too effective to the peak of the frequency characteristic as the volume is increased, hence unnatural feeling is created in the sound generation.

SUMMARY OF THE INVENTION

To resolve the above shortcomings, it is one objective of the present invention to provide an audio apparatus that can suppress the occurrence of clipping even at a high voltage level, while preserving as much of the original frequency characteristic as possible.

An inventive audio apparatus is constructed for use in negative drive of a loudspeaker having an internal impedance to perform a desired amplitude-frequency characteristic. In the inventive audio apparatus, an amplifier device drives the loudspeaker with a driving voltage. A feedback device performs a positive feedback of a signal corresponding to the driving voltage of the loudspeaker to the amplifier device with a variable feedback gain, thereby causing the amplifier device to generate a negative impedance effective to negate the internal impedance of the loudspeaker. An adjustment device decreases the variable feedback gain of the feedback device as a level of the driving voltage of the loudspeaker increases, thereby adjusting the amplitude-frequency characteristic of the amplifier device.

Preferably, the adjustment device comprises a detector that detects the signal corresponding to the driving voltage in terms of a load voltage of the loudspeaker, and a converter that converts the detected load voltage to a control voltage. Further, the feedback device comprises a voltage-controlled amplifier connected between the converter and the amplifier device, and having the variable feedback gain responsive to the control voltage from the converter to perform the positive feedback to the amplifier device. Preferably, the adjustment device decreases the variable feedback gain of the feedback device only if the level of the driving voltage exceeds a critical level, and otherwise keeps the variable feedback gain constant as long as the level of the driving voltage remains under the critical level. Preferably, the adjustment device decreases the variable feedback gain of the feedback device as the level of the driving voltage increases so as to suppress the amplitude-frequency characteristic of the amplifier device, thereby preventing an output of the amplifier device from clipping

DETAILED DESCRIPTION OF THE INVENTION

Figure 1:
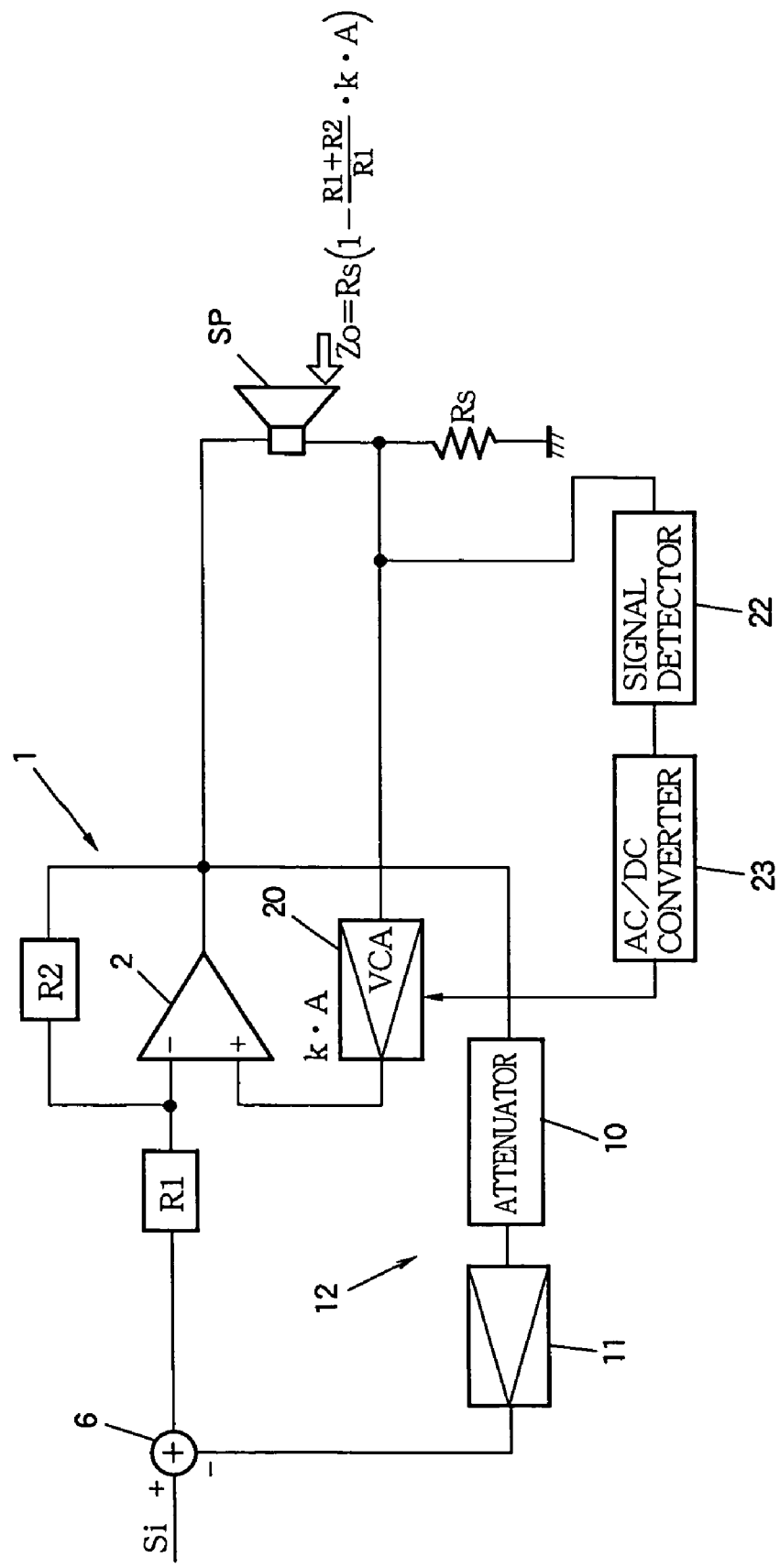
FIG. 1 is a block diagram illustrating the arrangement of one embodiment of the present invention.
Figure 4:
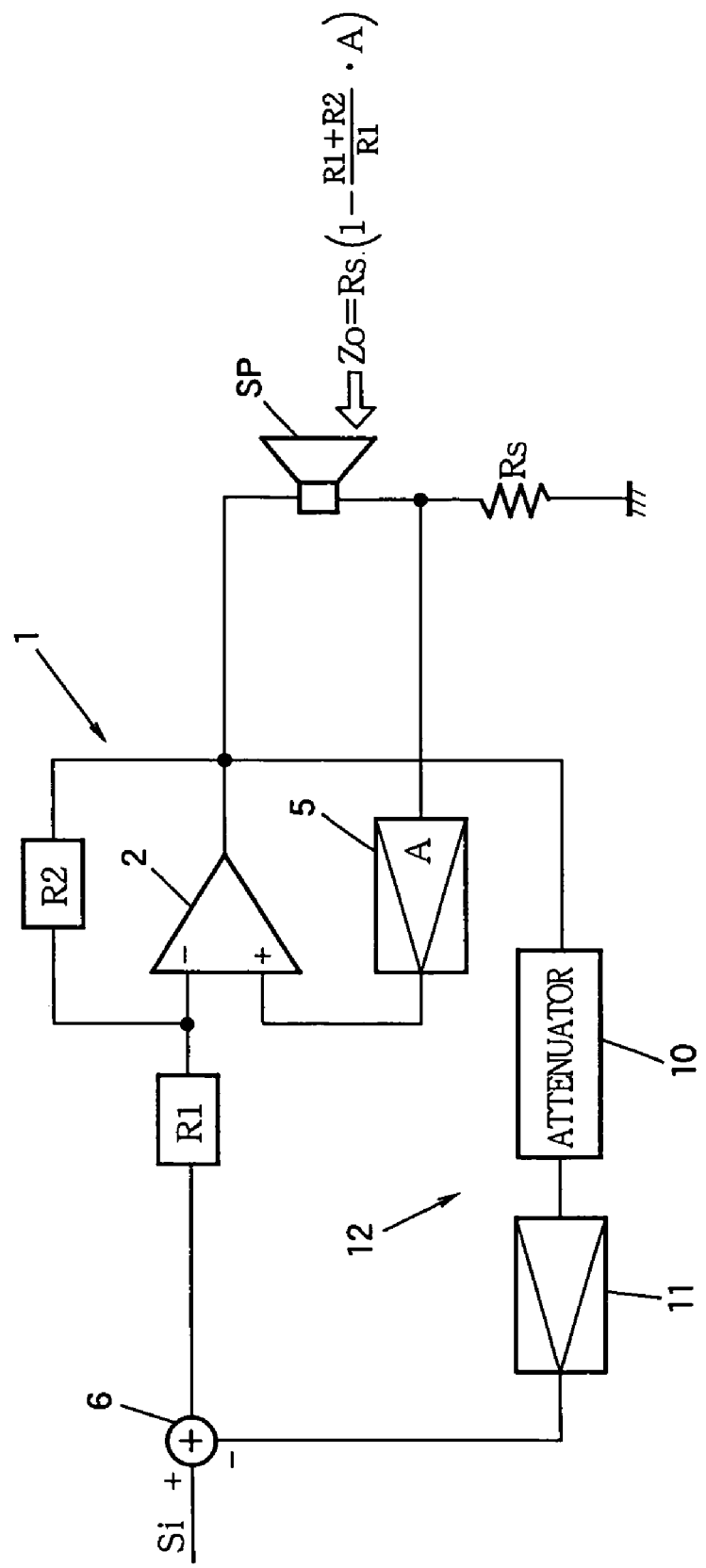
FIG. 4 is a block diagram illustrating the arrangement of the conventional audio apparatus.

One embodiment of the present invention will now be described while referring to the drawings. FIG. 1 is a block diagram illustrating the arrangement for one embodiment of the present invention. The same reference numerals as used in FIG. 4 are adopted in FIG. 1 to denote corresponding components. Namely, reference numeral 1 denotes an amplifier device in the form of an inversion amplification circuit 1 that includes resistors R1 and R2 for determining the amplification rate or gain of the amplification circuit 1, and a differential amplifier 2. A loudspeaker SP and a sensing resistor Rs are inserted in series between an output terminal of the differential amplifier 2 and the ground. The junction point of the loudspeaker SP and the resistor Rs connected via a voltage-controlled amplifier (VCA) 20 to a positive input terminal of the differential amplifier 2. In this case, an amplification rate or feedback gain of the voltage-controlled amplifier 20 is set to k·A. Reference numeral 6 denotes an adder, via which an input signal Si is inputted to the inversion amplification circuit 1. Further, an attenuator 10 and a level control circuit 11 together constitute a limiting circuit 12 that is inserted between the output terminal of the inversion amplification circuit 1 and the adder 6.

The voltage-controlled amplifier 20 has the amplification rate k·A variable in accordance with a control voltage Vc. The voltage-controlled amplifier 20 forms a feedback device in manner similar to the feedback amplifier 5 of FIG. 4. As the control voltage Vc is increased, the amplification rate of the voltage-controlled amplifier 20 is decreased.

Further, in FIG. 1, reference numeral 22 denotes a signal detector, which detects a voltage at a terminal of the sensing resistor Rs. A signal outputted by the signal detector 22 is converted into a direct current by an AC/DC converter 23. In this case, the AC/DC converter 23 provides a level of a load voltage of the loudspeaker SP. The signal detector 22 and the AC/DC converter 23 constitute an adjustment device and may be provided, for example, by combination of a rectification circuit and a smoothing circuit (i.e., an integrating circuit). In short, any arrangement can be employed so long as the level of the load voltage can be detected. The signal outputted by the AC/DC converter 23 is supplied as the control voltage Vc to the voltage-controlled amplifier 20, where the feedback gain of the voltage-controlled amplifier 20 is represented as k·A (where k denotes a variable that responds to the control voltage Vc, and A denotes a constant value).

In the inventive audio apparatus of FIG. 1, the inversion amplification circuit 1 feeds an electric signal to the loudspeaker SP so that the loudspeaker SP converts the electric signal into mechanical vibration to generate sounds. The inversion amplification circuit 1 performs the negative driving to generate the effective negative impedance, which can negate or cancel a specific internal impedance of the loudspeaker SP. Consequently, the loudspeaker SP operates well in response to the electric signal to generate the sounds with a good fidelity.

An output of the differential amplifier 2 having the gain of (R1+R2)/R1 is applied to a load of the loudspeaker SP. An electric current flowing the load of the loudspeaker SP is detected and positively fed back to the differential amplifier 2 through the voltage-controlled amplifier 20 having the variable feedback gain k·A. By such a circuit construction, the output impedance Zo of the inversion amplification circuit 1 is represented by $Zo = Rs \cdot (1-((R1+R2)/R1) \cdot k \cdot A)$, where Rs denotes the resistance of the sensing resistor Rs. The value of k·A(R1+R2)/R1 is set greater than 1 so that the output impedance Zo of the inversion amplification circuit 1 is made negative.

Figure 2:
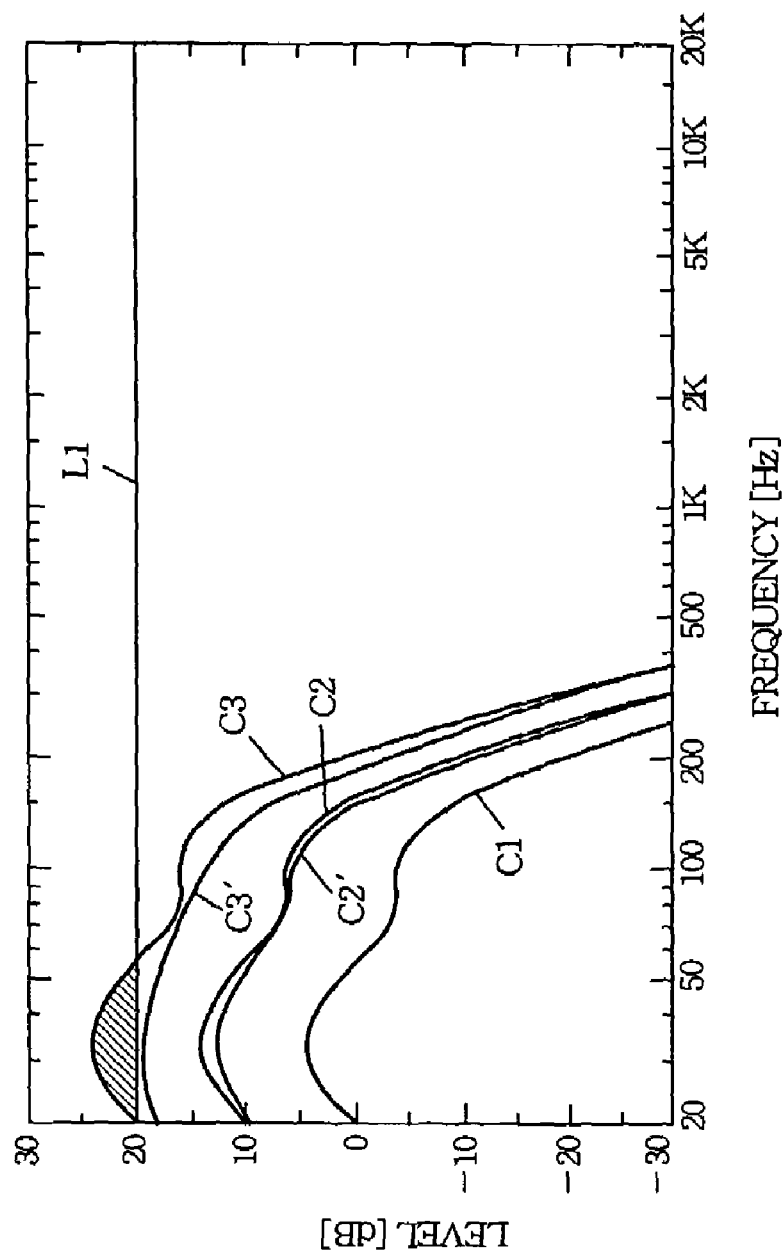
FIG. 2 is a waveform diagram showing the amplitude-frequency characteristics of the inventive audio apparatus and the conventional audio apparatus.

The frequency characteristics of the thus arranged circuit are represented by curves C2' and C3' in FIG. 2. It should be noted that for an input level of 0 dB, the frequency characteristic is represented by curve C1, which is the same as the curve for the conventional circuit of FIG. 4.

As is apparent from the curves C2' and c3' in FIG. 2, as the input voltage level to the loudspeaker SP is gradually increased (namely, the volume control is raised), the peak portion of the frequency characteristic is gradually suppressed. This is caused by the following reason. Namely, when the load voltage is increased, the amplification rate or feedback gain of the voltage-controlled amplifier 20 is decreased so that the level of the driving voltage applied to the loudspeaker SP through the negative resistance is reduced. Thus, the rise of the input voltage of the differential amplifier 2 to the loudspeaker SP is suppressed.

Figure 3:
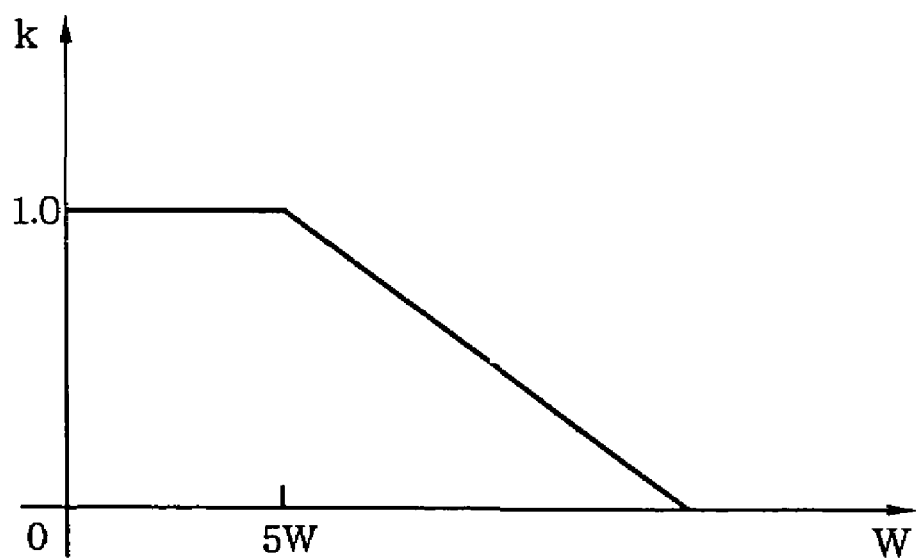
FIGS. 3(a) and 3(b) are graphs showing variation of a gain value "k" in this embodiment.
Figure 3:
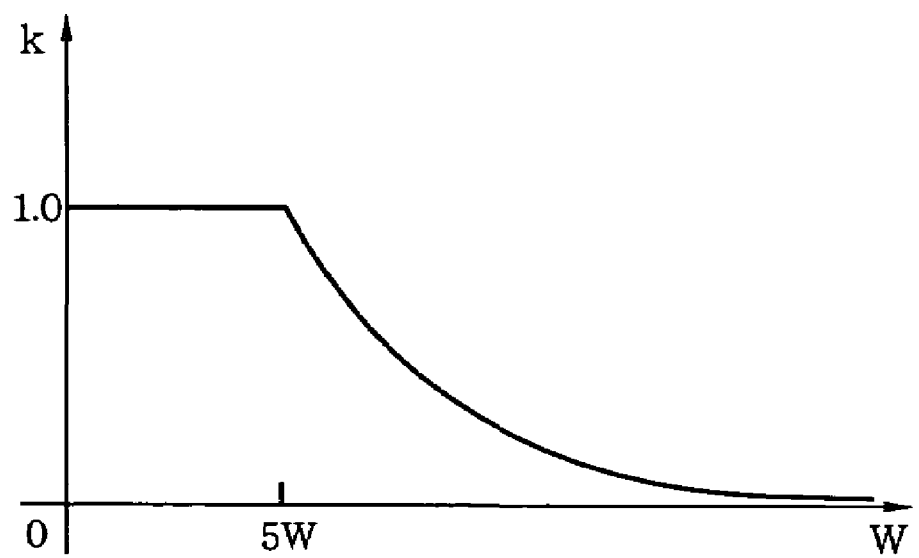

An example of relationship between k of the voltage-controlled amplifier 20 and the loudspeaker output is shown in FIGS. 3(a) and 3(b). In FIG. 3(a), the value of k is kept "1", and the amplification rate is made constant until the output from the loudspeaker SP reaches 5 W. When the loudspeaker output exceeds 5 W, as the loudspeaker output is gradually increased, the value of k is linearly decreased. Since such a characteristic curve represents the variation of the feedback gain of the voltage amplifier 20, the amplitude-frequency characteristics represented by the curves C2' and C3' shown in FIG. 2 are obtained when the large load voltage is detected.

As is shown in FIG. 3(b), the value of k may be reduced nonlinearly along a curve. In short, the characteristic of k should be so set that, when the load voltage is raised (namely, the loudspeaker output is increased), the level of the drive voltage created by the negative resistance is reduced.

In addition, a clip may occur in the low band area when the input voltage level is raised over the gain of the curve C3'. To prevent the clip, limiting process is performed by the limiting circuit 12 so that the output level does not exceed the limiting level L1. It should be noted that, in this embodiment, the input voltage level at which the limiting is triggered can be set higher than that set in the conventional apparatus of FIG. 4.

According to this invention, since the frequency characteristic is changed or adjusted to suppress the peak portion as the input voltage level is increased, the possibility of occurrence of the clipping can be reduced in accordance with the setting of the entire circuit without aid of the limiting circuit 12. Therefore, depending on the situation, the limiting circuit 12 may be eliminated.

As is described above, according to the present invention, the audio apparatus can be provided that can suppress the occurrence of clipping even at a high voltage level, while the audio apparatus can preserve the original frequency characteristic as much as possible.

What is claimed is:

1. An audio apparatus for use in a negative impedance drive of a loudspeaker having an internal impedance to perform a desired amplitude-frequency characteristic, comprising:

an amplifier device that drives the loudspeaker with a driving voltage;

a providing section, that provides a control voltage, having as an input a voltage level indicative of a driving current to the loudspeaker; and a feedback device having a variable feedback gain that performs a positive feedback of a signal corresponding to the driving voltage of the loudspeaker to a positive input terminal of the amplifier device thereby causing the amplifier device to generate a negative impedance effective to negate the internal impedance of the loudspeaker, the feedback device comprising a voltage-controlled amplifier having the variable feedback gain and receiving the signal corresponding to the driving voltage, the voltage-controlled amplifier being responsive to the control voltage from the providing section and the signal corresponding to the driving voltage for generating an output signal and positively feeding back the output signal to the positive input terminal of the amplifier device to thereby perform the positive feedback, wherein the providing section provides the control voltage that decreases the variable feedback gain as the voltage level indicative of the driving current to the loudspeaker increases, thereby adjusting the amplitude-frequency characteristic of the amplifier device, only if a level of a loudspeaker output exceeds a predetermined output level, and otherwise keeps the variable feedback gain constant as long as the level of the loudspeaker output remains under the predetermined output level.

2. The audio apparatus according to claim 1, wherein the providing section comprises a detector that detects the voltage level in terms of the driving current across a resistor, and a converter that converts the detected voltage to the control voltage.

3. The audio apparatus according to claim 1, wherein when the level of the loudspeaker output exceeds the predetermined output level, the variable feedback gain linearly decreases.

4. The audio apparatus according to claim 1, wherein when the level of the loudspeaker output exceeds the predetermined output level, the variable feedback gain decreases along a predetermined curve.

5. An audio apparatus for use in a negative impedance drive of a loudspeaker having an internal impedance to perform a desired amplitude-frequency characteristic, comprising:

an amplifier device that drives the loudspeaker with a driving voltage;

a providing section that provides a control voltage, having as an input a voltage level indicative of a driving current to the loudspeaker; and a feedback device having a variable feedback gain that performs a positive feedback of a signal corresponding to the driving voltage of the loudspeaker to a positive input terminal of the amplifier device thereby causing the amplifier device to generate a negative impedance effective to negate the internal impedance of the loudspeaker, the feedback device comprising a voltage-controlled amplifier having the variable feedback gain and receiving the signal corresponding to the driving voltage, the voltage-controlled amplifier being responsive to the control voltage from the providing section and the signal corresponding to the driving voltage for generating an output signal and positively feeding back the output signal to the positive input terminal of the amplifier device to thereby perform the positive feedback, wherein the providing section provides the control voltage that decreases the variable feedback gain as the voltage level indicative of the driving current to the loudspeaker increases, thereby adjusting the amplitude-frequency characteristic of the amplifier device so as to suppress the amplitude-frequency characteristic of the amplifier device, thereby preventing an output of the amplifier device from clipping, only if a level of a loudspeaker output exceeds a predetermined output level, and otherwise keeps the variable feedback gain constant as long as the level of the loudspeaker output remains under the predetermined output level.

6. The audio apparatus according to claim 5, wherein the providing section comprises a detector that detects the voltage level in terms of the driving current across a resistor, and a converter that converts the detected voltage to the control voltage.

7. The audio apparatus according to claim 5, wherein when the level of the loudspeaker output exceeds the predetermined output level, the variable feedback gain linearly decreases.

8. The audio apparatus according to claim 5, wherein when the level of the loudspeaker output exceeds the predetermined output level, the variable feedback gain decreases along a predetermined curve.

* * * * *